(12) United States Patent
Lee et al.

(10) Patent No.: US 7,119,574 B1
(45) Date of Patent: Oct. 10, 2006

(54) PASSAGE STRUCTURES FOR USE IN LOW-VOLTAGE APPLICATIONS

(75) Inventors: Andy L Lee, San Jose, CA (US); Wanli Chang, Saratoga, CA (US); Cameron McClintock, Mountain View, CA (US); John E Turner, Santa Cruz, CA (US); Brian D Johnson, Sunnyvale, CA (US); Chiao Kai Hwang, Fremont, CA (US); Richard Y Chang, East Palo Alto, CA (US); Richard G Cliff, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 132 days.

(21) Appl. No.: 10/637,258

(22) Filed: Aug. 8, 2003

Related U.S. Application Data

(62) Division of application No. 09/931,475, filed on Aug. 16, 2001, now Pat. No. 6,661,253.

(60) Provisional application No. 60/225,585, filed on Aug. 16, 2000.

(51) Int. Cl.
*H03K 19/177* (2006.01)

(52) U.S. Cl. .............................. 326/41; 326/38; 326/47; 326/101

(58) Field of Classification Search ............ 326/37–50, 326/101, 102, 103, 113
See application file for complete search history.

(56) References Cited

U.S. PATENT DOCUMENTS

| | | | |
|---|---|---|---|
| 4,713,557 A | 12/1987 | Carter | ........................ 307/242 |
| 4,821,233 A | 4/1989 | Hsieh | ......................... 365/203 |
| 4,831,596 A | 5/1989 | Tran | |
| 5,119,337 A | 6/1992 | Shimizu et al. | |
| RE34,363 E | 8/1993 | Freeman | ..................... 307/465 |
| 5,291,079 A | 3/1994 | Goetting | ..................... 307/465 |
| 5,544,097 A | 8/1996 | McClure et al. | |
| 5,574,634 A | 11/1996 | Parlour et al. | ................ 363/59 |
| 5,706,226 A * | 1/1998 | Chan et al. | ................. 365/156 |
| 5,717,340 A | 2/1998 | Mehrotra et al. | ........... 324/765 |
| 5,760,605 A | 6/1998 | Go | .............................. 326/49 |
| 5,783,962 A | 7/1998 | Rieger | |
| 5,841,694 A | 11/1998 | Wong | .................... 365/185.05 |
| 5,880,620 A | 3/1999 | Gitlin et al. | |
| 5,959,933 A | 9/1999 | Zheng | |
| 6,177,831 B1 | 1/2001 | Yoneda et al. | |
| 6,278,290 B1 * | 8/2001 | Young | ........................ 326/41 |
| 6,307,420 B1 | 10/2001 | Zhou | |
| 6,366,498 B1 | 4/2002 | Madurawe et al. | |
| 6,396,325 B1 | 5/2002 | Goodell | |
| 6,504,212 B1 | 1/2003 | Allen et al. | |

(Continued)

OTHER PUBLICATIONS

APEX 20K Programmable Logic Device Family, Data Sheet, Mar. 2000, ver. 2.06, Altera Corporation, pp. 1-208.

(Continued)

*Primary Examiner*—Anh Q. Tran
(74) *Attorney, Agent, or Firm*—Fish & Neave IP Group Ropes & Gray LLP

(57) ABSTRACT

Enhanced passgate structures for use in low-voltage systems are presented in which the influence of $V_t$ on the range of signals passed by single-transistor passgates is reduced. In one arrangement, the $V_{GATE}$–$V_t$ limit for signals propagated through NMOS passgates is raised by applying a higher $V_{GATE}$; in another arrangement, the $V_t$ is lowered. The use of CMOS passgates in applications where single-transistor passgates have traditionally been used is also presented.

15 Claims, 3 Drawing Sheets

U.S. PATENT DOCUMENTS

| | | |
|---|---|---|
| 6,535,034 B1 | 3/2003 | Wong .................... 327/108 |
| 6,563,367 B1 | 5/2003 | Lee |
| 6,577,514 B1 | 6/2003 | Shor et al. |
| 6,661,253 B1 | 12/2003 | Lee et al. |
| 6,876,572 B1 | 4/2005 | Turner |
| 2003/0053335 A1 | 3/2003 | Hart et al. |
| 2003/0071681 A1 | 4/2003 | Fujimori |
| 2003/0097628 A1 | 5/2003 | Ngo et al. |

OTHER PUBLICATIONS

FLEX 8000 Programmable Logic Device Family, Data Sheet, Jun. 1999, ver. 10.01, Altera Corporation, pp. 349-410.

FLEX 10K Embedded Programmable Logic Family, Data Sheet, Jun. 1999, ver. 4.01, Altera Corporation, pp. 1-137.

XC3000 Series Field Programmable Gate Arrays (XC3000A/L, XC3100A/L), Product Description, Nov. 9, 1998, ver. 3.1, Xilinx, Inc., pp. 7-3 through 7-78.

Betz et al., "FPGA Routing Architecture: Segmentation and Buffering to Optimize Speed and Density," Department of Electrical and Computer Engineering, University of Texas, pp. 59-68, Feb. 1999.

Dobbelaere et al., "Regenerative Feedback Repeaters for Programmable Interconnections," IEEE Journal of Solid-State Circuits, vol. 30, No. 11, pp. 1247-1253, Nov. 1995.

\* cited by examiner

PASSAGE STRUCTURES FOR USE IN LOW-VOLTAGE APPLICATIONS

CROSS REFERENCE TO RELATED APPLICATION

This application is a division U.S. patent application Ser. No. 09/931,475, filed Aug. 16, 2001 is now a U.S. Pat. No. 6,661,253 which is a nonprovisional of U.S. provisional patent application No. 60/225,585, filed Aug. 16, 2000. All of these prior applications are hereby incorporated by reference herein in their entireties.

BACKGROUND OF THE INVENTION

This invention relates to integrated circuit devices, and more particularly to the pass-gate structures which may be used in such devices.

One of the most ubiquitous structures within an integrated circuit device is the single-transistor passgate, which is commonly used to implement (either singly or in combination with other circuits) switches, multiplexers, logic functions (e.g., pass transistor logic), and gating mechanisms for tristatable circuits (e.g., buffers and drivers). In some integrated circuit devices, single-transistor passgate structures may account for a significant portion of the circuitry; for example, in the case of programmable logic devices, single-transistor passgates are used extensively throughout the device as part of the programmable interconnection circuitry.

The operation of a typical single-transistor passgate may be succinctly illustrated by a description of an NMOS passgate (analogous principles of operation, as understood by one skilled in the art, would apply for a PMOS passgate). Depending on whether the potential difference between its gate terminal, $V_{GATE}$, and its source terminal, $V_{SOURCE}$, exceeds the threshold voltage, $V_t$, an NMOS passgate acts as an "open" or a "closed" switch. (As is well-known in the art, there is no physical difference between the "source" and "drain" terminals of an MOS device; the source terminal of an NMOS transistor is the terminal having the lower voltage.) When $V_{GATE}-V_{SOURCE}$ is less than $V_t$, the NMOS passgate is in the "cutoff" state, thereby acting as an "open" switch; when $V_{GATE}-V_{SOURCE}$ is greater than $V_t$, the NMOS passgate is in the conduction state, thereby acting as a "closed" switch.

Accordingly, a ceiling is imposed on the output of an NMOS passgate in that it cannot exceed $V_{GATE}-V_t$ (since the NMOS passgate starts to enter the "cutoff" mode when $V_{GATE}-V_{SOURCE}$ approaches $V_t$). For example, when $V_{GATE}$ and a logic HIGH signal to be passed by an NMOS passgate both correspond to the positive supply level, $V_{DD}$, the signal that may be passed to the output of the NMOS passgate is limited to $V_{DD}-V_t$. Extending the analysis to the case of PMOS passgates, a lower limit equal to $|V_t|$ is imposed on logic LOW signals that may be passed. (As is well-known in the art, $V_t$ is not a discrete value for an MOS transistor; it may be considered a range of values that is influenced by a variety of second-order effects, such as substrate bias and subthreshold conduction. However, in order to simplify the illustration of the principles of the present invention, $V_t$ will be discussed herein as if it is a discrete value rather than a range of values.)

With the current trend in scaling down device geometries and the consequent use of ever-lower operating voltages (e.g., supply voltages, bias voltages, etc.), which are nearing levels comparable to $V_t$, the ability of single-transistor passgate structures to reliably pass recognizable logic levels will become more difficult in view of the influence $V_t$ exerts on the logic levels that may be propagated (i.e., the $V_{GATE}-V_t$ ceiling imposed on the logic HIGH voltage levels that are passed by NMOS passgates, and the $|V_t|$ lower limit on the logic LOW signals that are passed by PMOS passgates).

SUMMARY OF THE INVENTION

The present invention relates to enhanced passgate structures for use in low-voltage systems. In accordance with the principles of the present invention, various techniques are presented for mitigating the effect of $V_t$ on the range of signals that may be propagated through single-transistor pass-gates. Although the techniques described herein are illustrated using NMOS passgates, they may be readily adapted to PMOS structures.

In one arrangement, the $V_{GATE}-V_t$ limit imposed on the logic HIGH signals passed by NMOS passgates may be raised by applying higher $V_{GATE}$ levels, which may be provided from a variety of sources. Alternatively, the $V_{GATE}-V_t$ ceiling may be raised by lowering $V_t$ via process adjustments during fabrication and/or by tuning the biasing voltage of the well in which the passgate is fabricated.

Also, the use of CMOS passgates in applications where single-transistor passgates have traditionally been used is presented.

Further features of the invention, its nature and various advantages will be more apparent from the accompanying drawings and the following detailed description of the invention.

DETAILED DESCRIPTION OF THE INVENTION

For the purpose of simplifying the discussion of the principles of the present invention, the techniques and embodiments described herein will focus on NMOS passgates. However, the principles illustrated herein are applicable to similar arrangements involving PMOS pass-gates.

Figure 1:
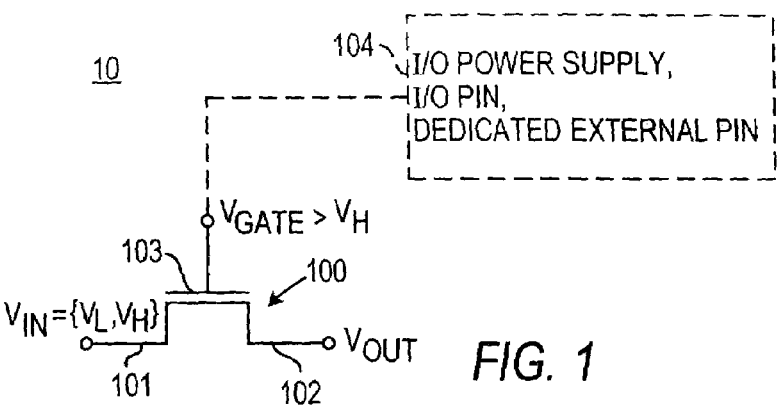
FIG. 1 is a schematic representation of an enhanced passgate structure which may be constructed in accordance with the principles of the present invention.

FIG. 1 illustrates one arrangement for reducing the effect of $V_t$ on the range of signals that may be passed by NMOS passgates in accordance with the principles of the present invention. In the arrangement shown in FIG. 1, the effect of the $V_{GATE}$-$V_t$ limit on the signals passed by NMOS passgate 100 may be offset by applying as $V_{GATE}$ a voltage level that exceeds the logic HIGH signals, $V_H$, to be passed by NMOS passgate 100. For example, if $V_H$ corresponds to the positive supply voltage, $V_{DD}$, then a $V_{GATE}$ that exceeds $V_{DD}$ would be applied to NMOS passgate 100 to turn it "ON". In some designs, depending on the process being used and the voltage difference between $V_H$ and the higher $V_{GATE}$, NMOS passgate 100 may be a high-voltage tolerant transistor, such as a thick-oxide device, in order to reliably handle the higher $V_{GATE}$.

For the purposes of the present invention, $V_{GATE}$ may be a static bias voltage or a dynamic signal. In one embodiment, as illustrated in FIG. 1, the higher $V_{GATE}$ may be derived from any of a variety of sources 104, such as the positive I/O supply voltage, $V_{DD\text{-}I/O}$ (e.g., when the core circuitry and the I/O circuitry have separate power supplies and $V_{DD\text{-}I/O}$ is greater than $V_H$), an I/O pin (e.g., control/data signals provided from an external source that uses signalling levels higher than $V_H$), or a dedicated external pin on which a voltage greater than $V_H$ is applied (e.g., bias voltages, auxiliary power supply voltages, etc.).

In other embodiments, depending on the application, the higher $V_{GATE}$ may also be generated by any of a variety of voltage boosting/conversion circuitry such as charge pumps and voltage converters (e.g., DC/DC, AC/DC, etc.).

Rather than increasing $V_{GATE}$, another way to raise the $V_{GATE}$-$V_t$ ceiling is to lower the threshold voltage, $V_t$. Although transistors may be fabricated with threshold voltages close to zero volts (e.g., "native" devices), there is a tradeoff between decreasing $V_t$ and increasing the leakage current during the "OFF" state. In accordance with the principles of the present invention, it is thus preferable to lower the associated threshold voltages of those specific transistors which may be used as pass-gates.

Figure 2:
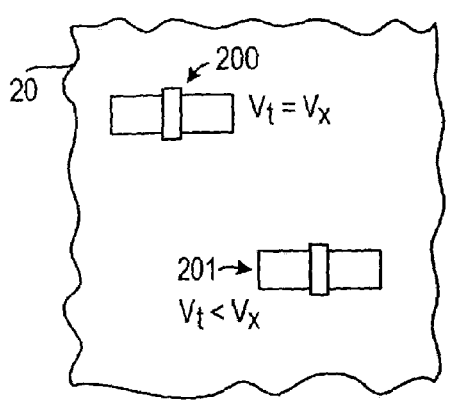
FIG. 2 is a simplified illustration of an aspect of an integrated circuit device which may be fabricated in accordance with the principles of the present invention.
Figure 3:
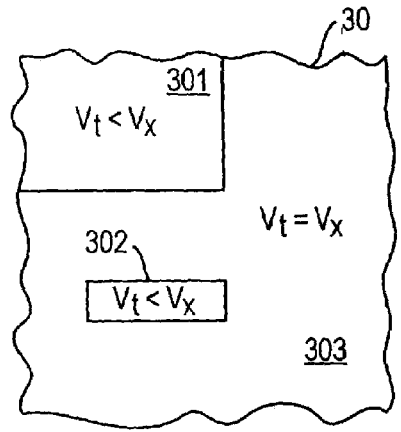
FIG. 3 is a simplified illustration of an aspect of another integrated circuit device which may be fabricated in accordance with the principles of the present invention.

One arrangement for accomplishing this is shown in FIG. 2, which schematically illustrates a portion of a representative integrated circuit device 20, in which two transistors have been fabricated with different threshold voltages. As shown in FIG. 2, one of the transistors 200, which is to be configured for operation as part of a circuit other than a passgate structure, may be fabricated with an associated $V_t$ equal to $V_x$, whereas the other transistor 201, which is to be configured for operation as a passgate, may be fabricated with an associated $V_t$ that is less than $V_x$. Expanding on the arrangement shown in FIG. 2, FIG. 3 shows a portion of an integrated circuit device 30, which is divided into different sections 301/302/303, wherein all the transistors within a given section have been fabricated with a specific threshold voltage that may be different from that of the transistors in the other sections. For example, sections 301 and 302 may each be a routing network with a high concentration of passgates (which may be used to construct, for example, interconnection switches and multiplexers). Accordingly, the transistors in sections 301 and 302 could be fabricated with a $V_t$ that is lower than that of the transistors in other sections 303.

Figure 4:
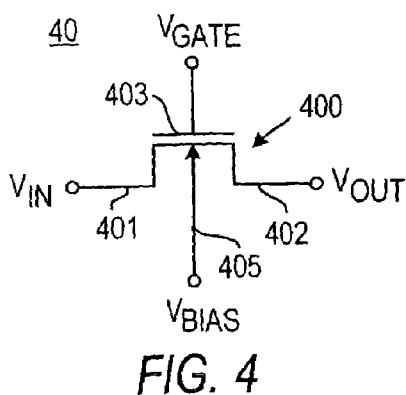
FIG. 4 is a schematic representation of another enhanced passgate structure which may be constructed in accordance with the principles of the present invention.
Figure 5:
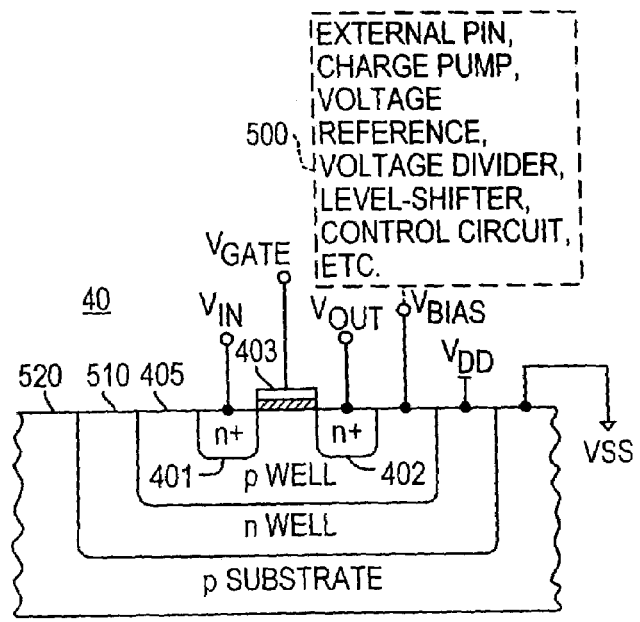
FIG. 5 illustrates an aspect of the enhanced passgate structure of FIG. 4 in greater detail.

As an alternative, or in addition, to selectively fabricating low $V_t$ transistors, FIGS. 4 and 5 illustrate an arrangement wherein a lower $V_t$ may be achieved by controlling the bias voltage, $V_{BIAS}$, of the well 405 in which the NMOS passgate 400 is fabricated. For the purposes of the present invention, NMOS passgate 400 is preferably fabricated in a well 405 which is capable of being biased to a voltage that is different from that which is used to bias the substrate 520. In the illustrative embodiment shown in FIG. 5, for example, a triple-well process may be used to allow p-well 405 to be biased separately from the p-substrate 520, thereby allowing the $V_t$ of NMOS passgate 400 to be adjusted as a function of the source-to-bulk potential difference, $V_{SB}$, which, in the arrangement shown in FIG. 5, is dependent on $V_{BIAS}$. The relationship between $V_t$ and $V_{SB}$ for an NMOS transistor, which should be familiar to those skilled in the art, may be expressed as follows:

$$V_t = V_{t0} + \gamma[sqrt(V_{SB} + 2\Phi_F) - sqrt(2\Phi_F)]$$

(wherein $V_{t0}$ is the threshold voltage when $V_{SB}$ is zero, g is the body-effect constant, and $\Phi_F$ is a term associated with the doping of the well). Accordingly, the $V_t$ of NMOS passgate 400 may thus be lowered by creating a negative $V_{SB}$ by setting the bias voltage, $V_{BIAS}$, of well 405 to a level that is higher than the voltage level present on the source terminal of NMOS passgate 400. For the purposes of the present invention, $V_{BIAS}$ should not be high enough to forward bias the junction between the source/drain 401/402 and the p-well 405. Accordingly, in some embodiments, $V_{BIAS}$ may be set to a voltage that is slightly higher than the lowest possible voltage that may be present on the source terminal (e.g., if the lowest possible voltage that could be applied to the source terminal is ground, then $V_{BIAS}$ would be set to a voltage level that is slightly above ground).

In accordance with the principles of the present invention, $V_{BIAS}$ may be derived from any of a variety of sources and bias generation schemes 500, which may be either internal or external to the integrated circuit device which includes NMOS pass-gate 400. Such sources 500 may include external pins, charge pumps, voltage references, voltage dividers, level-shifters, control/feedback circuitry, and the like. In some designs, $V_{BIAS}$ may be provided as a static voltage, which may or may not correspond to any of the supply voltages used on the integrated circuit device. In other designs, it may be preferable to use a dynamic voltage for $V_{BIAS}$, which may be provided by a control circuit that generates a variable $V_{BIAS}$ that may be a function of any of a variety of parameters, such as process variations, temperature, voltage, current, or a combination thereof. As a result, the $V_t$ of NMOS passgate 400 may be tuned in a feedback loop to achieve a low $V_t$ that optimizes, for example, the tradeoff between lowering $V_t$ and increasing leakage current. In accordance with the principles of the present invention, the techniques described in the foregoing, and illustrated in FIGS. 1–5, for reducing the effect of $V_t$ on the $V_{GATE}$-$V_t$ ceiling on signals passed by NMOS passgates may be combined to achieve an even greater reduction.

Figure 6:
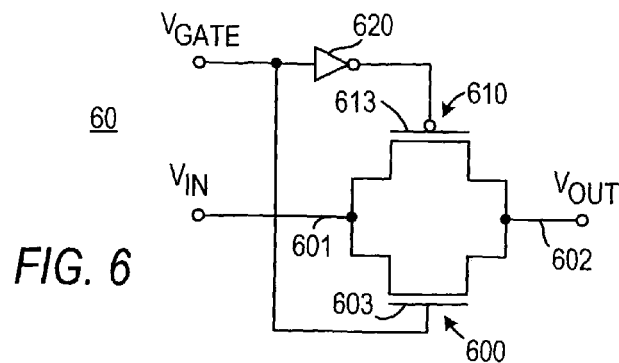
FIG. 6 is a schematic representation of a passgate structure which may be used in accordance with the principles of the present invention.

Instead of increasing $V_{GATE}$ or modifying $V_t$ in order to raise the $V_{GATE}$-$V_t$ ceiling imposed on signals passed by single-transistor NMOS passgates, the effect of $V_t$ may be eliminated by using a fully complementary passgate structure, such as CMOS passgate 60 shown in FIG. 6. For some applications (e.g., interconnection switches, multiplexers, gating mechanisms for tristatable circuits, etc.), the use of single-transistor passgate has traditionally been preferred because a CMOS passgate includes at least two transistors (NMOS transistor 600 and PMOS transistor 610), and may further include auxiliary circuitry for generating and/or accommodating complementary $V_{GATE}$ signals (e.g., inverter 620 shown in FIG. 6), thereby taking up more area and having more parasitic capacitance than a single-transistor pass-gate.

Despite the increased area and capacitance, however, the use of CMOS passgates in those applications.

(e.g., interconnection switches for programmable logic devices) where single-transistor passgates have traditionally been used may be reasonable in view of the trend in scaling down supply voltages since CMOS structures scale easily and are capable of passing full logic levels.

Figure 7:
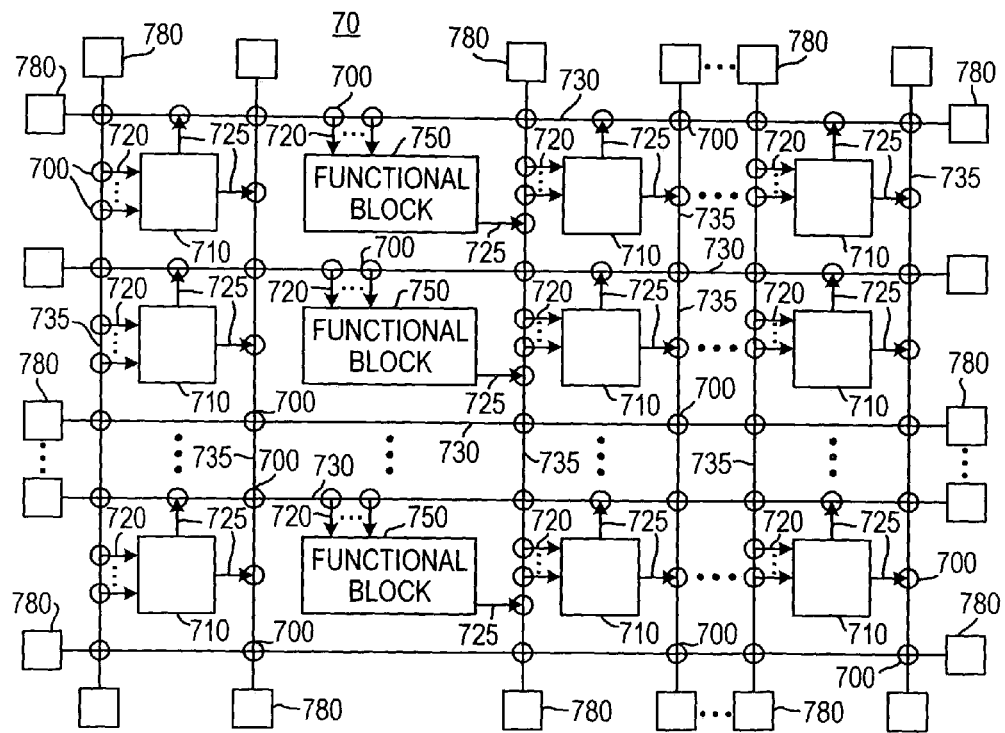
FIG. 7 is a simplified block diagram of a programmable logic device.

The above-described passgate structures 10/201/40/60 that may be constructed in accordance with the principles of the present invention are especially useful in integrated circuit devices, such as programmable logic devices, in which such pass-gate structures are used as interconnection switches to allow programmable routing and switching. FIG. 7 is a simplified block diagram of an illustrative programmable logic device 70 in which interconnection switches using passgate structures that have been constructed in accordance with the principles of the present invention may be readily used. Programmable logic device 70 includes a plurality of regions of programmable logic 710 operatively disposed in a two-dimensional array of rows and columns, and a programmable network of horizontal 730 and vertical 735 interconnection conductors for conveying signals amongst the logic regions 710 and various I/O structures 780. In the network of interconnection conductors 730/735, signals may be programmably routed via interconnection switches 700, which, in some designs, may also be grouped to form multiplexers. In some embodiments, programmable logic device 70 may also include any of a variety of functional blocks 750, such as memory structures, multiplier/accumulator blocks, arithmetic logic units, microprocessors, etc. Functional blocks 750 may be dedicated structures that are configured to implement a specific function, or, alternatively, they may be user-programmable/reconfigurable structures.

Figure 8:
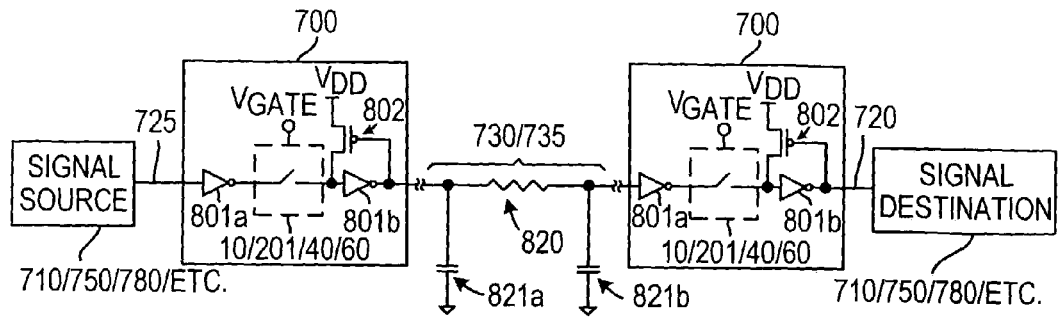
FIG. 8 illustrates how an aspect of the programmable logic device of FIG. 7 may be improved in accordance with the principles of the present invention.

FIG. 8 illustrates in greater detail how interconnection switches 700 may be used in the network of interconnection conductors 730/735 to route signals within programmable logic device 70. For the purpose of illustrating the principles of the present invention, a signal source/destination within programmable logic device 70 may be any of the logic regions 710, functional blocks 750, I/O structures 780, or other circuitry within programmable logic device 70. As schematically illustrated in FIG. 8, a signal may be routed from any given source to any given destination by using interconnection switches 700 to multiplex or switch signals provided on the output leads 725 of signal source 710/750/780/etc. onto the network of interconnection conductors 730/735 (within which interconnection switches 700 may also be used to programmably connect one interconnection conductor to another), from which the signal may be eventually multiplexed or switched onto the input lead 720 of signal destination 710/750/780/etc. As shown in FIG. 8, the electrical characteristics of the network of interconnection conductors 730/735 may be represented as a chain of resistors 820 and capacitors 821a/b in a "black-box" abstraction.

Also shown in FIG. 8 is one embodiment of an interconnection switch 700 that may be constructed using the above-described enhanced passgate structures in accordance with the principles of the present invention. As illustrated in FIG. 8, interconnection switch 700 may include any of the pass-gates 10/201/40/60 as the switching mechanism. In some embodiments, a pair of inverters 801a and 801b, along with a "half-latch" PMOS transistor 802, may also be included to provide buffering of the input and output signals.

Figure 9:
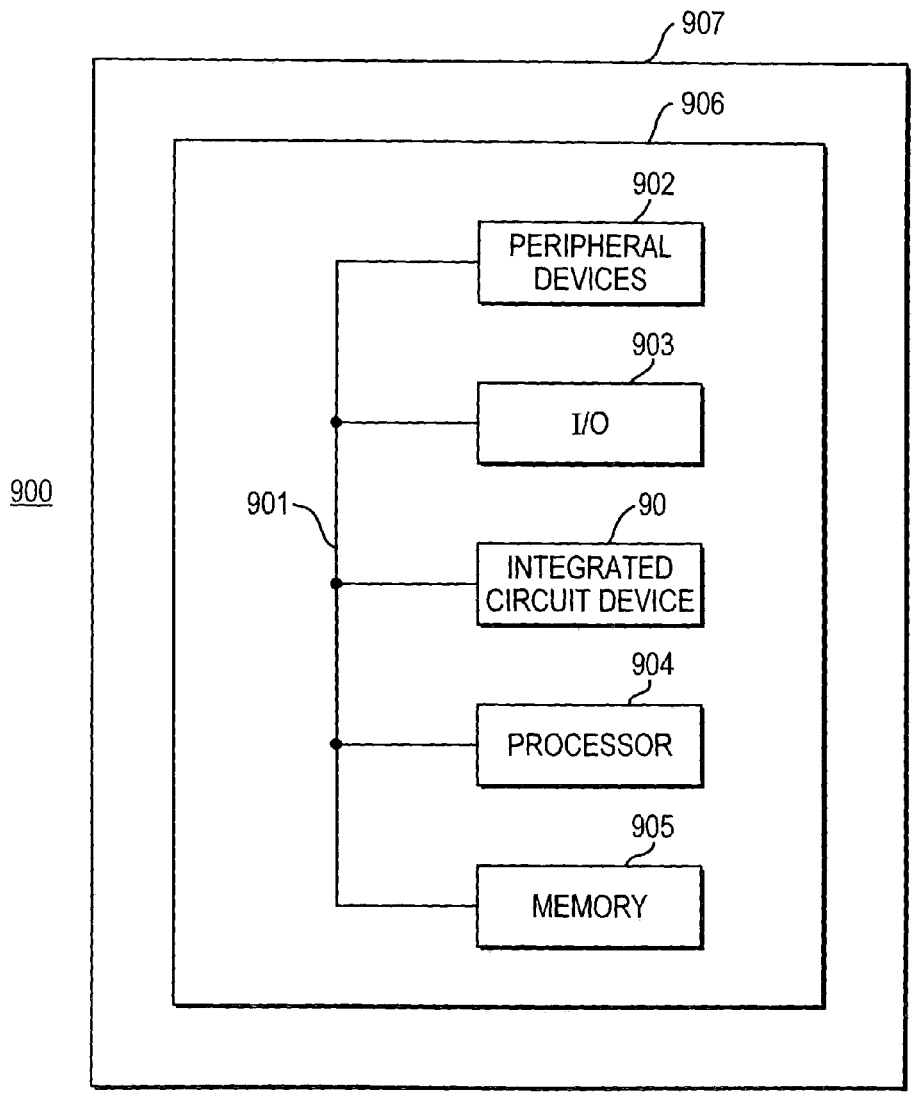
FIG. 9 is a simplified block diagram of an illustrative system that includes an integrated circuit device which has been improved in accordance with the principles of the present invention.

FIG. 9 shows how an integrated circuit device 90 (e.g., a programmable logic device) employing any of the enhanced passgate structures that have been described in the foregoing may be used in a system 900. System 900 may include one or more of the following components: various peripheral devices 902, I/O circuitry 903, a processor 904, and a memory 905. These components may be coupled together by a system bus 901 and may be populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. Integrated circuit device 90, employing passgate structures that have been constructed in accordance with the principles of the present invention, may be used to perform a variety of different logic functions. For example, integrated circuit device 90 can be configured as a processor or controller that works in cooperation with processor 904. Integrated circuit device 90 may also be used as an arbiter for arbitrating access to a shared resource in system 900. In yet another example, integrated circuit device 90 may be configured as an interface between processor 904 and one of the other components in syste.

Various technologies may be used to implement the integrated circuit device 90 employing pass-gate structures that have been constructed in accordance with the principles of the present invention. Moreover, this invention is applicable to both one-time-only programmable and reprogrammable devices.

Thus, it is seen that enhanced pass-gate structures for an integrated circuit device have been presented. One skilled in the art will appreciate that the present invention may be practiced by other than the described embodiments, which are presented for purposes of illustration and not of limitation, and the present invention is limited only by the claims which follow.

What is claimed is:

1. A method of fabricating a programmable logic device, the method comprising:
    fabricating a first plurality of transistors each having a first threshold voltage; and
    fabricating a second plurality of transistors in associated wells configured to be biased separately from the substrate, wherein the threshold voltage of each transistor of the second plurality is reduced by applying a bias voltage to the associated well such that the reduced threshold voltage is lower than the first threshold voltage, and wherein each transistor in the second plurality is grouped to form connections between interconnect lines on the programmable logic device.

2. A programmable logic device fabricated on a substrate, comprising:
    a first plurality of transistors having a first threshold voltage;
    a second plurality of transistors, each transistor having a drain terminal, a source terminal, a gate terminal, a well connection, and an initial threshold voltage of a given magnitude, the transistor having been fabricated in an associated well that is configured to be biased separately from the substrate, wherein the drain terminal, the source terminal, and the gate terminal are configured to allow the transistor to pass signals between the source terminal and the drain terminal when a control voltage is applied on the gate terminal, and wherein the initial threshold voltage of the transistor is reduced by applying a bias voltage to the associated well, and such that the reduced threshold voltage is lower than said first threshold voltage of the first plurality of transistors.

3. The programmable logic device defined in claim 2 wherein the associated well in which the transistor has been fabricated is a triple-well, the transistor being a NMOS transistor placed in a p-well surrounded by an n-well, wherein the n-well is built into the substrate, and wherein the bias voltage is applied to the p-well and the substrate is grounded.

4. The programmable logic device defined in claim 3, wherein the bias voltage being applied to the p-well is set to a voltage level that is above that of the lowest possible voltage that is capable of being applied to the source terminal.

5. The programmable logic device defined in claim 2 wherein the bias voltage is applied to the associated well through one of a plurality of external pins.

6. The programmable logic device defined in claim 2 wherein the bias voltage is applied by a level-shifter, a charge pump, a reference voltage generator, or a voltage divider circuit.

7. The programmable logic device defined in claim 2 wherein the bias voltage is provided by a control circuit which generates a variable output signal based on at least one of a plurality of measurable circuit parameters related to the transistor.

8. The programmable logic device defined in claim 7, wherein the plurality of measurable circuit parameters includes process variations, temperature, voltage, and current.

9. For a programmable logic device having been fabricated on a substrate and including a first plurality of transistors having a first threshold voltage, and a second plurality of transistors, each having a drain terminal, a source terminal, a gate terminal, a well connection, and an initial threshold voltage of a given magnitude, each transistor having been fabricated in an associated well that is configured to be biased separately from the substrate, a method of operating each of the second plurality of transistors comprising:
  configuring the drain terminal, the source terminal, and the gate terminal to allow the transistor to pass signals between the source terminal and the drain terminal when a control voltage is applied on the gate terminal; and
  decreasing the magnitude of the initial threshold voltage of the transistor by applying a bias voltage to the associated well such that said decreased threshold voltage is lower than the said first threshold voltage of the first plurality of transistors.

10. The method defined in claim 9 wherein the associated well in which the transistor has been fabricated is a triple-well, the transistor being a NMOS transistor placed in a p-well surrounded by an n-well, wherein the n-well is built into the substrate, and wherein the bias voltage is applied to the p-well and the substrate is grounded.

11. The method defined in claim 10 further comprising:
  setting the bias voltage being applied to the p-well to a voltage level that is above that of the lowest possible voltage that is capable of being applied to the source terminal.

12. The method defined in claim 9 further comprising:
  providing the bias voltage to the associated well through one of a plurality of external pins.

13. The method defined in claim 9 further comprising:
  supplying the bias voltage using a level-shifter, a charge pump, a reference voltage generator, or a voltage divider circuit.

14. The method defined in claim 9 further comprising:
  generating the bias voltage with a control circuit that generates a variable output signal based on at least one of a plurality of measurable circuit parameters related to the transistor.

15. The method defined in claim 14, wherein the plurality of measurable circuit parameters includes process variations, temperature, voltage, and current.

* * * * *